(12) United States Patent  (10) Patent No.: US 7,741,982 B2
Johansson et al.  (45) Date of Patent: Jun. 22, 2010

(54) ESTIMATION OF TIMING ERRORS IN A TIME-INTERLEAVED ANALOG TO DIGITAL CONVERTER SYSTEM

(75) Inventors: Håkan Johansson, Linköping (SE); Per Löwenborg, Linköping (SE)

(73) Assignee: Signal Processing Devices Sweden AB, Linkoping (SE)

( * ) Notice: Subject to any disclaimer, the term of this patent is extended or adjusted under 35 U.S.C. 154(b) by 11 days.

(21) Appl. No.: 11/883,718

(22) PCT Filed: Feb. 4, 2005

(86) PCT No.: PCT/SE2005/000149

§ 371 (c)(1),
(2), (4) Date: Apr. 15, 2008

(87) PCT Pub. No.: WO2006/083199

PCT Pub. Date: Aug. 10, 2006

(65) Prior Publication Data

US 2008/0291064 A1  Nov. 27, 2008

(51) Int. Cl.
*H03M 1/12* (2006.01)
(52) U.S. Cl. .................................. 341/118; 341/120
(58) Field of Classification Search .................. 341/118, 341/120, 155
See application file for complete search history.

(56) References Cited

U.S. PATENT DOCUMENTS

| | | | | |
|---|---|---|---|---|
| 5,239,299 | A * | 8/1993 | Apple et al. | 341/118 |
| 5,294,926 | A * | 3/1994 | Corcoran | 341/120 |
| 5,294,969 | A | 3/1994 | Ito | |
| 5,568,142 | A | 10/1996 | Velazquez et al. | |
| 6,384,756 | B1 | 5/2002 | Tajiri et al. | |
| 6,522,282 | B1 * | 2/2003 | Elbornsson | 341/155 |
| 2002/0075177 | A1 | 6/2002 | Lowenborg et al. | |

(Continued)

FOREIGN PATENT DOCUMENTS

WO  WO 0249217 A2  6/2002

(Continued)

OTHER PUBLICATIONS

Communication dated May 21, 2008 in counterpart European Application No. 05711027.2-2206.

(Continued)

*Primary Examiner*—Howard Williams
(74) *Attorney, Agent, or Firm*—Harness, Dickey & Pierce, P.L.C.

(57) ABSTRACT

A method for estimating a relative time difference vector in a group of digitized signals from a time interleaved analog-to-digital module having a plurality of parallel and time interleaved analog-to-digital converters. The method comprises the steps of selecting (S1) one of said digitized signals as a reference signal, calculating (S2-S3) an actual time delay between each of the remaining signals and said reference signal, and subtracting (S4), for each of said remaining signals, an intended interleaving time delay from said time delay. In order for this method to provide the correct estimate, the signal must be bandlimited, not only to the system bandwidth, but to the bandwidth of one ADC. However, given this bandwidth limitation, the estimation is very precise, and therefore enables reconstruction of the digitized signal without feedback.

8 Claims, 3 Drawing Sheets

U.S. PATENT DOCUMENTS

2002/0093439 A1    7/2002  Lundin et al.
2006/0017599 A1*   1/2006  Elbornsson .................. 341/155

FOREIGN PATENT DOCUMENTS

WO    WO 2004/079917 A1    9/2004

OTHER PUBLICATIONS

Valimaki et al., "Principles of Fractional Delay Filters", *IEEE*, pp. 3870-3873 (2000).

Hakan Johansson, "Reconstruction of Nonuniformity Sampled Bandlimited Signals by Means of Digital Fractional Delay Filters", *IEEE Trans. On Signal Proc.*, vol. 50, No. 11, pp. 2757-2767 (Nov. 2002).

Hakan Johansson et al., "Reconstruction of Nonuniformity Sampled Bandlimited Signals Using Digital Fractional Delay Filters", *IEEE*, pp. II-593-596 (2001).

Jonas Elbornsson et al., "Blind Adaptive Equalization of Mismatch Errors in a Time-Interleaved A/D Converter System", IEEE Trans on Circuits & Sys., vol. 51, No. 1, pp. 151-158 (Jan. 2004).

Suk Yu Hui et al., "Challenges in the Migration to 4G Mobile Systems," *IEEE Comm. Mag.*, vol.41, No. 12, pp. 54-59 (Dec. 2003).

Robert H. Walden, "Analog-to-Digital Converter Survey and Analysis," *IEEE J. Sel. Areas in Comm.*, vol. 17, No. 4, pp. 539-550 (Apr. 1999).

William C. Black, Jr., "Time Interleaved Converter Arrays," *IEEE J. Solid-State Circuits*, vol. SC-15, No. 6, pp. 1022-1029 (Dec. 1980).

Huawen Jen et al., "A Digital-Background Calibration Technique for Minimizing Timing-Error Effects in Time-Interleaved ADC's," *IEEE Trans. Circuits Syst. II*, vol. 47, No. 7. pp. 603.-613 (Jul. 2000).

Håkan Johannson, "Reconstruction of Nonuniformly Sampled Bandlimited Signals by means of Digital Fractional delay Filters," *IEEE Trans. Signal Proc.*, vol. 50, No. 11, pp. 2757-2767 (Nov. 2002).

Per Lowenberg, Asymmetric Filter Banks for Mitigation of Mismatch Errors in High-Speed Analog-to-Digital Converters, *Linköping studies in science and technology*, Diss. No. 787, Linköping University, Sweden (Dec. 2002).

James C. Candy et al., "Oversampling Methods for A/D and D/A Conversion," *Oversampling Delta-Sigma Data Converters Theory, Design and Simulation*, New York IEEE Press, pp. 1-29 (1992).

A. Eshraghi et al., "A Time-Interleaved Parallel ΣΔ A/D Converter," *IEEE Trans. Circuits Syst. Ii*, vol. 50, No. 3, pp. 118-129 (Mar. 2003).

P. Lowenberg et al., "On the Frequency Response of M-Channel Mixed Analog and Digital Maximally Decimated Filter Banks," *Proc. European Conf. Circuit Theory Design*, Stresa, Italy, vol. 1, pp. 321-324 (Aug. 29-Sep. 2, 1999).

Per Lowenberg et al., "Analysis of Continuous-Time-Input Sigma-Delta Modulators and their Generalizations," *European Conf. Circuit Theory Design*, Krakow, Poland (Sep. 1-4, 2003).

Håkan Johannson, "Reconstruction of Nonuniformly Sampled Bandlimited Signals Using Time-Varying Discrete-Time FIR Filters," *Proc. XII European Signal Proc. Conf.*, Vienna, Austria (Sep. 6-10, 2004).

Jonas Elbornsson et al., "Blind Adaptive Equalization of Mismatch errors in a Time-Interleaved A/D Converter System," *IEEE Trans. Circuits Syst. I*, vol. 51, No. 1, pp. 151-158 (Jan. 2004).

Håkan Johannson, "Reconstruction of a Class of Nonuniformly Sampled and Decimated Bandlimited Signals," *Proc. IEEE Int. Symp Circuits Syst.*, Phoenix, USA (May 26-29, 2002).

Daihong Fu et al. "A Digital Background Calibration Technique for Time-Interleaved Analog-to-Digital Converters". IEE Journal of Solid-State Circuits, vol. 33, No. 12, pp. 1904-1911. Dec. 12, 1998.

Saul R. Dooley et al. "On explicit time display estimation using the Farrow structure". Signal Processing 72, pp. 53-57. Jun. 22, 1998.

* cited by examiner

ESTIMATION OF TIMING ERRORS IN A TIME-INTERLEAVED ANALOG TO DIGITAL CONVERTER SYSTEM

TECHNICAL FIELD

The invention relates to a method and system for estimating errors introduced in a time-interleaved analog-to-digital converter system.

TECHNICAL BACKGROUND

Due to its robustness and precision, digital signal processing (DSP) has replaced analog signal processing (ASP) in most technical fields, and enabled the development of information systems such as mobile communication systems and sophisticated medical aids. However, the real world is analog by nature, and there is therefore an increasing need for high performance analog-digital interfaces (ADI's) (in the simplest case realized using a conventional analog-to-digital converter).

The role of the ADI is to convert signals from analog to digital representation. This conversion is principally done in two steps; sampling and quantization. The resolution of the ADI is the number of bits used in the quantization. The data rate of the ADI is the number of samples produced per second on average.

Typically, the sampling is performed with a fixed sampling period, T. This type of sampling is called uniform sampling, and the data rate is simply 1/T. Processing as well as reconstruction are simplified if the signals have been sampled uniformly, and it is therefore assumed here that the ADI is to perform uniform sampling. Since ADIs incorporate quantizers, it is inevitable that errors are introduced in the conversions. In an ideal ADI, the quantization errors can be made arbitrarily small by increasing the resolution, i.e., by allocating more bits for the sample values. However, in a physical ADI, the situation is not as simple because, in such a physical device, several other types of errors will eventually dominate over the quantization errors. In other words, the effective (true) resolution is determined by the influence of several different physical phenomena, and it tends to decrease as the data rate increases.

A natural way of increasing the ADI performance is to operate several converters in parallel, enabling an increase in data rate and/or resolution. In a conventional time-interleaved converter, the data rate is increased whereas the resolution is ideally maintained (the same as in each sub-converter).

A drawback with parallel ADC:s is that the parallelization introduces channel mismatch errors that degrades the resolution. In order to obtain both high data rates and high resolution it is therefore necessary to incorporate additional digital signal processing that estimates and corrects for the channel mismatch errors. Errors introduced by the parallel structure are for example gain and/or offset errors, and timing errors between the different ADC:s. Correcting for the gain and/or offset errors are easily done in a precondition module, but the technical challenge lies in removing the timing errors between the different ADC:s.

In order to remove these mismatch errors (deskew the digitized signal), the timing errors between the different ADC:s must first be determined. These timing errors can then be used to define the filter coefficients of a reconstruction filter, adapted to remove the timing errors from the digitized signal.

One approach to determine the timing errors is to apply a known calibration signal, and compare the resulting digitized signal with the expected result. An example of this approach is given in the journal paper "A digital-background calibration technique for minimizing timing-error effects in time-interleaved ADC's" by H. Jin and E. K. F. Lee. Such an approach requires careful timing of input and output, in order to enable a correct comparison, and this makes the method very difficult to implement with high precision.

Instead, it has been proposed to estimate the timing errors from an unknown, but bandlimited signal. One example of such an estimation in a parallel ADC is given in WO 04/079917. In the system described in WO 04/079917, the digitized signal can be used to estimate the timing errors, as long as it is band limited to the system bandwidth. However, this requires feedback of the reconstructed signal to the estimator, so that each iteration of the timing error estimation is based on the current reconstruction.

OBJECTS OF THE INVENTION

It is an object of the present invention to provide estimation of timing errors with such precision that no feedback of the reconstructed signal is required.

It is a further object to enable reconstruction of a digitized signal by means of an unknown bandlimited calibration signal.

SUMMARY OF THE INVENTION

These and other objects are achieved by a method for estimating a relative time difference vector in a group of digitized signals from a time interleaved analog-to-digital module having a plurality of parallel and time interleaved analog-to-digital converters. The method comprises the steps of selecting one of said digitized signals as a reference signal, calculating an actual time delay between each of the remaining signals and said reference signal, and subtracting, for each of said remaining signals, an intended interleaving time delay from said time delay.

According to the invention, the timing error for each ADC sequence is estimated by a comparison of this sequence with the reference sequence. For each pair, a relative time delay is calculated, and the timing error can then be determined as the difference between this delay and the intended interleaving time delay between the two ADCs.

In order for this method to provide the correct estimate, the signal must be bandlimited, not only to the system bandwidth, but to the bandwidth of one ADC. The reason is that the digitized signals that are compared are sampled sequences from only one ADC. If the input signal has a bandwidth greater than the bandwidth of each ADC, these sequences will be distorted, making any comparison useless.

However, given this bandwidth limitation, the estimation is very precise, and therefore enables reconstruction of the digitized signal without feedback.

Preferably, the step of calculating the time delay between each sequence and the reference sequence comprises defining a loss function as a measure of the difference between the sequences as a function of the delay between them, and minimizing this loss function with respect to the delay. This process determines the delay that, as closely as possible, makes the two compared sequences equal.

In one embodiment the loss function is defined by applying a delay to each of the remaining signals. As obvious to the man skilled in the art, the delay can equally well be applied to the reference signal, since the result will be the same, with exception for the sign of the time delay. In practice the applied delay is actually negative, i.e. it compensates for the delay already present between the signals.

The delay is preferably implemented by a fractional delay filter, and most preferably a Lagrange, Farrow Structure or Thiran Allpass filter. The use of any of the above said filters for implementing a fractional delay filter is favored, as its filter response will have derivatives with respect to the delay that can be calculated analytically. This also further improves the numerical stability.

The general use of fractional delay filter for determining the delay between two signal is shown in the journal paper "On explicit time delay estimation using the Farrow structure" by S. R. Dooley and A. K. Nandi. However, estimation of timing errors in a parallel ADC according to the present invention, i.e. by determining the actual delay between each channel compared to a reference channel, has never been described before. Therefore, the skilled person has had no reason to contemplate using the teachings of Dooley and Nandi for estimation of timing errors in a parallel ADC system.

The loss function can be defined as a delay energy function for the delayed reference signal and each of the remaining signals, and said energy function is minimized using a mean square difference.

BRIEF DESCRIPTION OF THE DRAWINGS

Preferred embodiments of the present invention will be further described in the following, with reference to the appended drawings.

DETAILED DESCRIPTION OF THE PREFERRED EMBODIMENT

Figure 1:
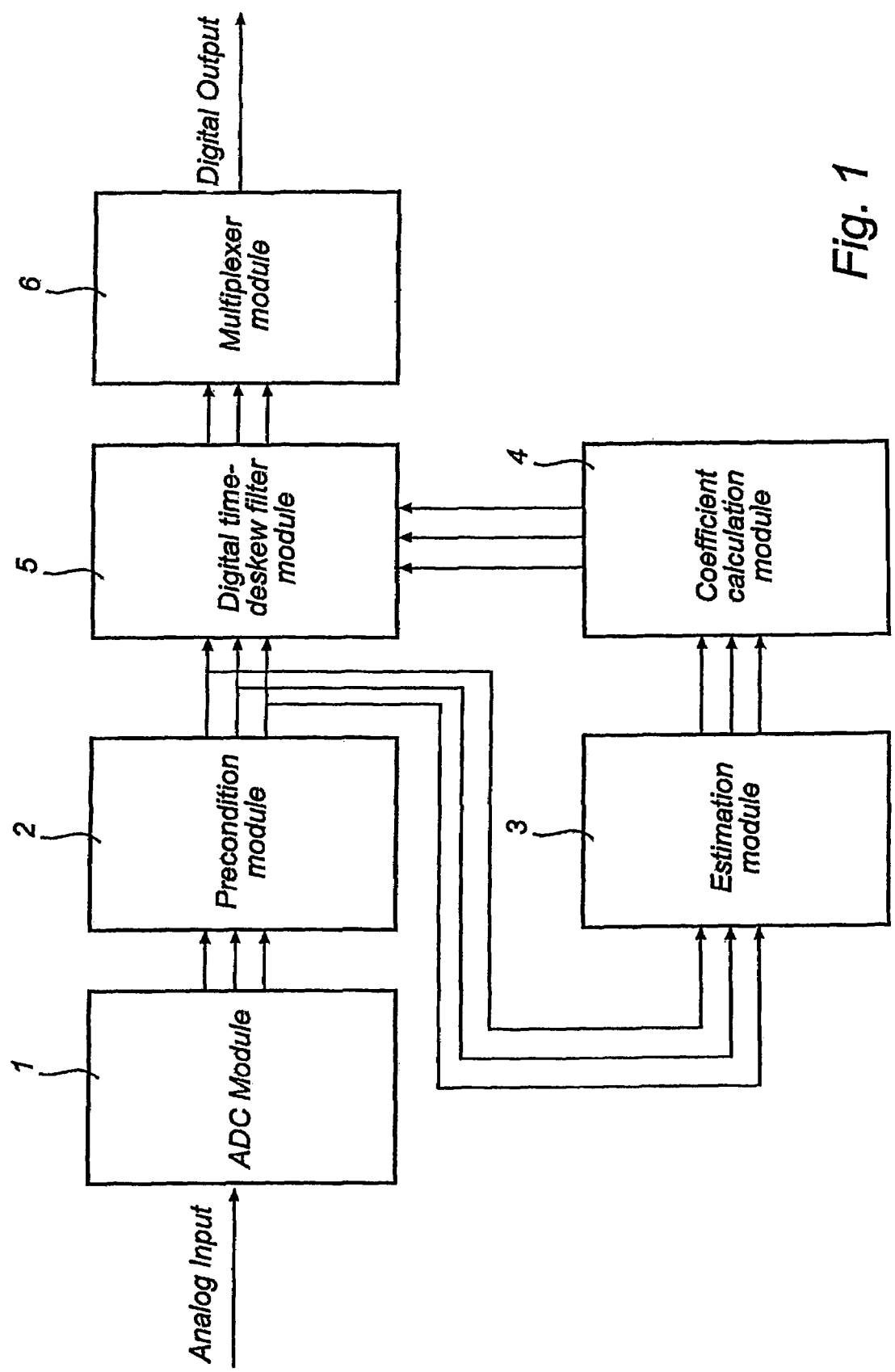
FIG. 1 illustrates a block diagram of an embodiment of the invention.

The first embodiment of the invention as a general block diagram is shown in FIG. 1, showing a time-interleaved analog-to-digital converter system according to an embodiment of the present invention, wherein said system receives an analog input signal and produces a digitized representation of said signal. The system in FIG. 1 comprises a time interleaved analog-to-digital module 1, having M parallel and time interleaved analog-to-digital converters, a preconditioning module 2, arranged to correct for offset and/or gain errors, a time-deskew estimation module 3, arranged to estimate a relative time-deskew vector and a coefficient calculation module 4, arranged to calculate time-deskew filter coefficients based on said relative time-deskew vector. The system in FIG. 1 further comprises a digital time-deskew filter module 5, arranged to receive said digitized signals and to deskew the relative time error, based on said time-deskew filter coefficients, in order to generate time-deskewed output signals. The system in FIG. 1 also comprises a multiplexer module 6 arranged to receive a plurality of time-deskewed output signals from said filter module and to provide an interleaved output signal.

The system in FIG. 1 operates in two steps, the estimation phase and the time-deskew phase. In the estimation phase, the timing errors between the different ADC:s are determined. These timing errors are then used to define the filter coefficients of the digital time-deskew filter module 5. In the time-deskew phase, the estimation module 3 and the filter coefficient calculation module 4 may be turned off, wherein the system can operate at a lower power. Further, in step 2 the gain and/or offset errors are corrected by the preconditioning module 2, and the digital time-deskew filter module 5 time-deskews the digitized signal, based on said filter coefficients determined in step 1. The time-deskewed signal is then multiplexed, and outputs an interleaved and time-deskewed digitized output signal.

As obvious to the man skilled in the art, the system may further comprise a controllable input filter module that can be arranged to filter the analog input signal to a bandwidth suitable for both the estimation phase and the time-deskew phase. In the estimation phase the input signal needs to be bandlimited to the Nyquist frequency of one single ADC, and in the deskew phase the input signal needs to be bandlimited to the Nyquist frequency of the full system, this to avoid aliasing.

It should be noted that the two steps may be active simultaneously. This can be advantageous if the band limited calibration signal is superposed on the input signal to be digitized, for example by time-interleaving or frequency-interleaving.

Figure 2:
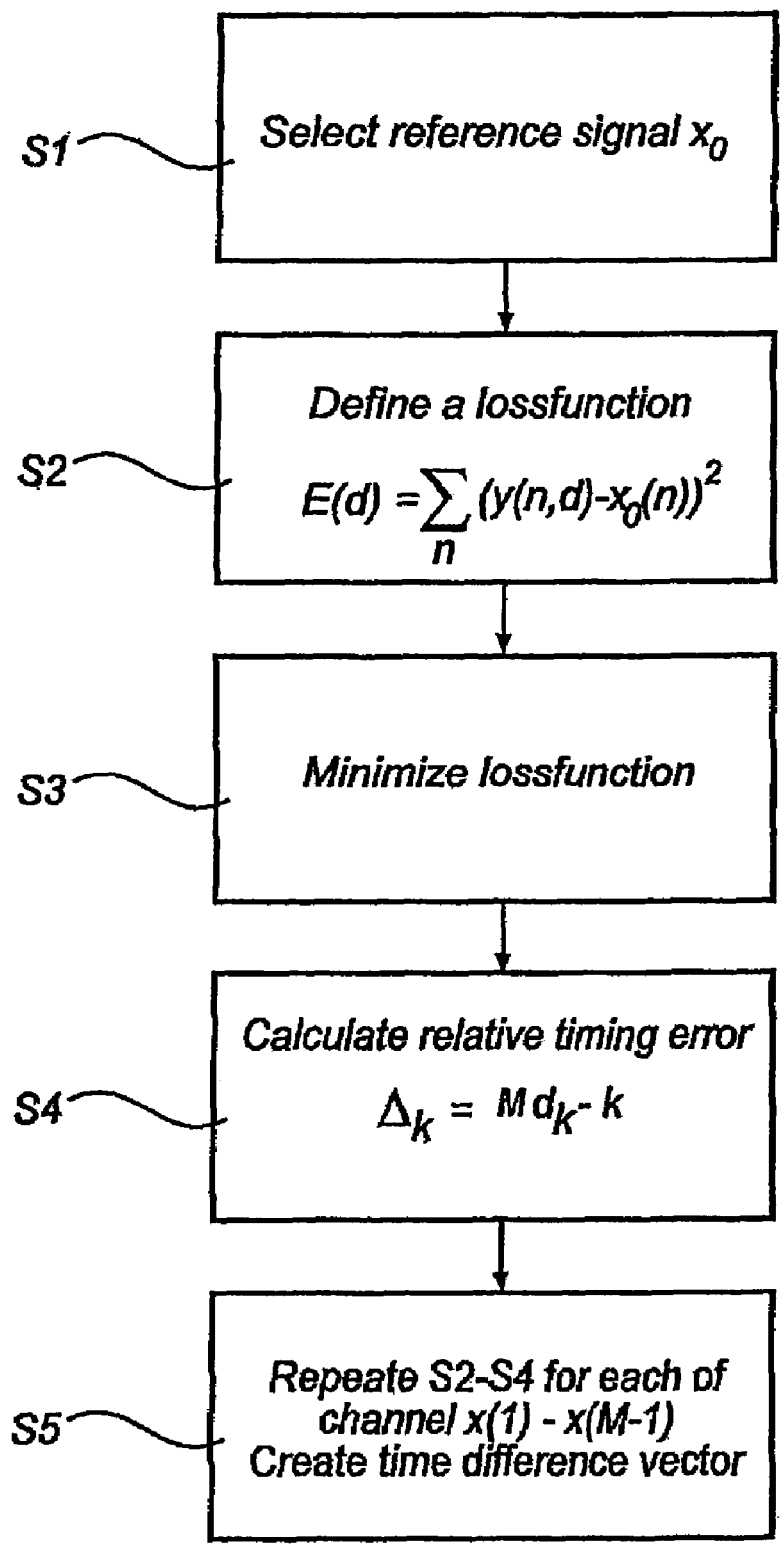
FIG. 2 illustrates a flowchart of an embodiment of the invention.

In FIG. 2 a flowchart according to an embodiment of the present invention is shown. The flowchart shows a detailed description of the digital signal processing steps performed by the time-deskew estimation module 3 in the estimation phase.

The calculations are performed on sequences $x_0$-$x_{M-1}$ acquired from the M ADC:s. The length of each sequence, N, can be selected by the skilled person, but as an example, 1024 samples is considered adequate. As the method is performed in a sampled system, any time period will be expressed in terms of the sampling period of the system. Therefore, it is important to note that the sampling period of the entire system is equal to the interleaving delay between adjacent ADC:s, T. The sampling period of each ADC, on the other hand, is here MT.

It should be noted, that in the present example the parallelization is used to increase the data rate with maintained resolution, leading to the ADC sampling period MT. However, as the skilled person realizes, in the case where an increase in resolution is desired, the sampling period of each ADC can be shorter than MT, and in the extreme case the same as for the system sampling period, T. This will lead to an over sampled system and a decimation filter will be required on the output signal.

In step S1 one of the digitized signals, $x_0$, is selected as a reference signal. It will be assumed that the error in the reference signal, $x_0$, is zero, and that the errors in all of the remaining signals, $x_1$-$x_{M-1}$, are relative to the reference signal. As obvious to the man skilled in the art, this will not introduce any limitation since the absolute sampling time is not important. Further, steps S2-S5 are performed for each of the remaining signals, $x_1$-$x_{M-1}$.

In steps S2-S4, the actual delay between the reference signal and a signal $x_k$ is determined, expressed in terms of the sampling period of the ADC, $t_{delay}=d_kMT$. Signal $x_k$ is one of said remaining signals $x_1$-$x_{M-1}$. This delay is then compared to the theoretical interleaving delay that should be present between $x_0$ and $x_k$, i.e. kT.

It should be noted that in the general case, where $x_r$ is selected as reference, the theoretical delay is kT-rT.

First, in step S2, a loss function is defined that can be minimized in order to determine the delay, $t_{delay}$. In the illustrated example, the delay is determined by minimizing, in the least square sense, the difference between the calculation signal and the reference signal delayed by an arbitrary time-delay, d, indicating a fraction of the sampling period MT. As said signal $x_k$ passes the delay device it forms a delayed signal y, which gives the lossfunction:

$$E(d) = \sum_n (y(n, d) - x_0(n))^2,$$

where the sum is taken over the ensemble of samples N (e.g. 1024 samples).

Of course, the delay can equally well be applied to the reference signal $x_0$. The result will be the same, with exception for the sign of the time delay.

In step S3, the loss function E is minimized. Typically, a standard numerical method is applied in order to find the value of d (referred to as $d_k$) that minimizes E.

As the loss function E is a sum of squares, the loss function will essentially have the shape of a second order polynome, having a well define minimum. The delayed signal y(n,d) can be found by applying a suitable time delay filter to the signal $x_k$, such as a fractional delay filter. By choosing a certain type of filter, such as a Lagrange, Farrow Structure or Thiran Allpass filter, the filter response can be differentiated analytically (with respect to d), which is very useful in the numerical determination of the minimum. By using one of the above mentioned filters it is needed to compensate for an inherent time delay introduced by said fractional delay filters.

Figure 3A:
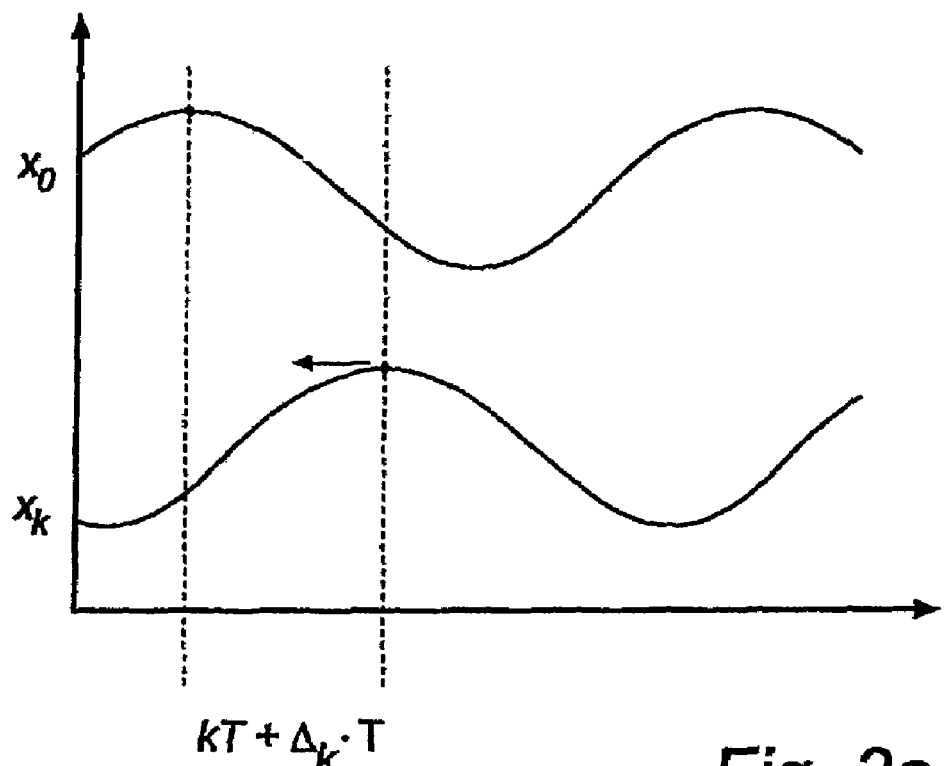
FIG. 3a-b illustrates comparison of analog signals corresponding to sequences acquired from different ADC:s.
Figure 3B:
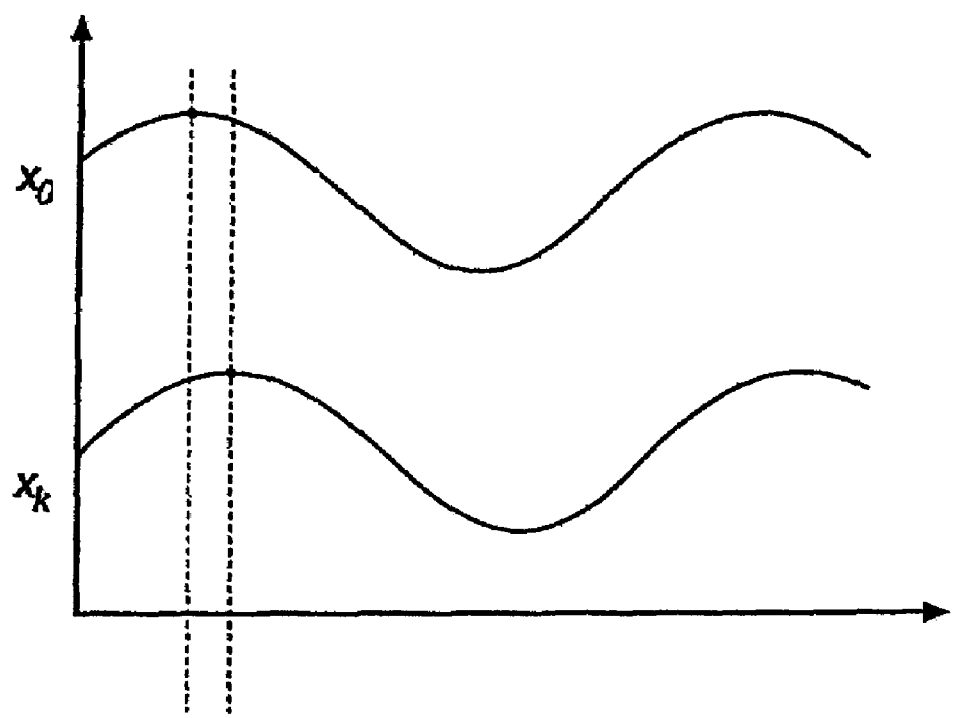

The process in steps S2 and S3 is more easily understood with reference to FIGS. 3a and 3b. FIG. 3a illustrates analog signals corresponding to sequences sampled from two ADC: s. The first sequence is the reference sequence $x_0$. The second sequence, $x_k$, is essentially a time delayed version of the reference sequence. The delay is equal to kT, plus some timing error, also expressed in terms of the system sampling period, $t_{error} = \Delta_k T$. The loss function E can be seen as a measure of how different the two sequences are, when one of them (here the sequence formed by signal $x_k$) is delayed, e.g. by a delay filter. This is illustrated in FIG. 3b, where the $x_k$-sequence is moved to the left. By moving said sequence an adequate amount (compensating for the delay, $t_{delay}$), the difference between the sequences will be minimized.

In step S4, the relative timing-error, $\Delta_k$, is calculated by subtracting the intended interleaving time delay, k, from the minimized time difference, $d_k$. Here, it is important to note that the factor $d_k$ relates to the sampling period of one ADC, MT, while the factors k and $\Delta_k$ relate to the sampling period of the system, T. This results in the expression $\Delta_k = M d_k - k$.

Step S5 ensures that steps S2-S4 are repeated for each channel $x_1 - x_{M-1}$, thus firming a relative time difference vector, $\Delta_k$ (k=0 ... M-1).

It is clear that the skilled person may make modifications to the above described preferred embodiments without departing from the inventive concept. For example, the system may be arranged in such a way that the multiplexer module 6 is arranged to multiplex the digitized signals from the preconditioning module 2, wherein the digital time-deskew filter module 5 will be arranged to receive an interleaved input signal and produce a time-deskewed signal. In yet another example the estimation phase might be interspersed with the time-deskew phase.

Further, as is obvious to the skilled man, the system might also be arranged in such a way that the sampling rates are different for each of the parallel and time interleaved analog-to-digital converters in the time interleaved analog-to-digital module 1. Such differences in sampling rates can be handled by suitable sampling rate conversions in association with the calculation of the delays, $d_k$.

In another example, the time-deskew estimation module 3 might be arranged to receive the digitized signals before the gain and/or offset errors are corrected by the preconditioning module 2.

In yet another example the system might be arranged to operate without a preconditioning module 2.

The invention claimed is:

1. A method for estimating a relative time difference vector in a group of digitized signals from a time interleaved analog-to-digital module having a plurality of parallel and time interleaved analog-to-digital converters, said method comprising:
   selecting one of said digitized signals as a reference signal,
   calculating an actual time delay between each of the remaining digitized signals and said reference signal, and
   subtracting, for each of said remaining digitized signals, an intended interleaving time delay from said actual time delay.

2. The method according to claim 1, wherein said actual time delay is calculated by defining a loss function as a measure of a difference between sequences as a function of the delay therebetween, and minimizing the loss function.

3. The method according to claim 2, wherein the step of defining the loss function comprises applying a delay to each of said remaining digitized signals and thereby forming a delayed signal.

4. The method according to claim 3, wherein said delay is applied using a fractional delay filter.

5. A method according to claim 4, wherein said fractional delay filter is implemented using at least one of Lagrange, Farrow Structure and Thiran Allpass.

6. The method according to claim 1, wherein the loss function is defined as a sum over an ensemble of samples of squared differences between said delayed signal and said reference signal.

7. An estimation module for estimating a relative time difference vector in a group of digitized signals from a time interleaved analog-to-digital module having a plurality of parallel and time interleaved analog-to-digital converters, said estimation module being adapted to
   select one of said digitized signals as a reference signal,
   calculate an actual time delay between each of the remaining digitized signals and said reference signal, and
   subtract, for each of said remaining digitized signals, an intended interleaving time delay from said actual time delay.

8. A system for deskewing relative time errors in a group of digitized signals from a time interleaved analog-to-digital module having a plurality of parallel and time interleaved analog-to-digital converters, comprising:
   an estimation module according to claim 7,
   a filter coefficient calculation module, arranged to calculate time-deskew filter coefficients based on said relative time-deskew vector, and
   a digital time deskew filter module, arranged to apply said filter coefficients to the digitized signals from the analog-to-digital module.

* * * * *